(12) United States Patent
Suryavanshi et al.

(10) Patent No.: US 11,133,466 B1
(45) Date of Patent: Sep. 28, 2021

(54) METHODS FOR CONTROLLING SWITCHING CHARACTERISTICS OF A CORRELATED ELECTRON MATERIAL DEVICE

(71) Applicant: Cerfe Labs, Inc., Austin, TX (US)

(72) Inventors: Saurabh Vinayak Suryavanshi, Mountain View, CA (US); Lucian Shifren, San Jose, CA (US); Carlos Alberto Paz de Araujo, Colorado Springs, CO (US); Jolanta Bozena Celinska, Colorado Springs, CO (US)

(73) Assignee: Cerfe Labs, Inc., Austin, TX (US)

( * ) Notice: Subject to any disclaimer, the term of this patent is extended or adjusted under 35 U.S.C. 154(b) by 0 days.

(21) Appl. No.: 16/862,428

(22) Filed: Apr. 29, 2020

(51) Int. Cl.
  *G11C 11/00* (2006.01)
  *H01L 45/00* (2006.01)
  *G11C 13/00* (2006.01)

(52) U.S. Cl.
  CPC ...... *H01L 45/1616* (2013.01); *G11C 13/0002* (2013.01); *H01L 45/1233* (2013.01); *H01L 45/1641* (2013.01)

(58) Field of Classification Search
  CPC ............. H01L 45/1616; H01L 45/1233; H01L 45/1641; G11C 13/0002
  USPC ....................................................... 365/148
  See application file for complete search history.

(56) References Cited

U.S. PATENT DOCUMENTS

| | | | |
|---|---|---|---|
| 7,298,640 B2 | 11/2007 | Chen et al. | |
| 7,639,523 B2 * | 12/2009 | Celinska ................ | H01L 45/04 365/148 |
| 7,778,063 B2 * | 8/2010 | Brubaker ................ | G11C 11/24 365/148 |
| 7,872,900 B2 * | 1/2011 | Paz de Araujo ........ | H01L 45/04 365/148 |
| 9,627,615 B1 * | 4/2017 | Reid ................... | G11C 13/0069 |
| 9,653,682 B1 | 5/2017 | Chou et al. | |
| 9,997,702 B2 | 6/2018 | Reid et al. | |
| 10,002,665 B1 | 6/2018 | Bhargava et al. | |
| 10,134,986 B2 * | 11/2018 | Reid ................... | H01L 45/1233 |
| 10,580,981 B1 | 3/2020 | Paz De Araujo et al. | |
| 10,854,811 B2 * | 12/2020 | Besser ................ | H01L 45/1233 |
| 11,005,039 B2 | 5/2021 | Paz De Araujo et al. | |
| 2008/0107801 A1 | 5/2008 | Celinska et al. | |
| 2009/0090899 A1 | 4/2009 | Lim et al. | |

(Continued)

FOREIGN PATENT DOCUMENTS

| | | |
|---|---|---|
| WO | 2009114796 A1 | 9/2009 |
| WO | 2017160233 A1 | 9/2017 |
| WO | 2017222525 A1 | 12/2017 |

OTHER PUBLICATIONS

U.S. Appl. No. 16/271,377, filed Feb. 8, 2019, 63 Pages.

(Continued)

*Primary Examiner* — Viet Q Nguyen
(74) *Attorney, Agent, or Firm* — Berkeley Law & Technology Group, LLP

(57) ABSTRACT

Methods are disclosed herein for controlling the switching characteristics of correlated electron material (CEM) switching devices. The methods comprise one or more of controlling a density of grain boundaries in the CEM layer, controlling an open pore porosity in the CEM layer and controlling a surface area of exposed surfaces of the CEM layer during the fabrication of the CEM switching devices.

19 Claims, 5 Drawing Sheets

(56) References Cited

U.S. PATENT DOCUMENTS

| | | | |
|---|---|---|---|
| 2013/0112935 | A1 | 5/2013 | Himeno et al. |
| 2013/0285699 | A1 | 10/2013 | McWilliams et al. |
| 2014/0097396 | A1 | 4/2014 | Murase et al. |
| 2014/0131654 | A1 | 5/2014 | Tu et al. |
| 2014/0252295 | A1 | 9/2014 | Liao et al. |
| 2015/0243708 | A1 | 8/2015 | Ravasio et al. |
| 2016/0163978 | A1 | 6/2016 | Paz De Araujo et al. |
| 2016/0268505 | A1 | 9/2016 | Sung et al. |
| 2017/0213960 | A1* | 7/2017 | Paz de Araujo ........ C23C 16/56 |
| 2017/0237001 | A1 | 8/2017 | Reid et al. |
| 2017/0301859 | A1 | 10/2017 | Paz De Araujo et al. |
| 2017/0317143 | A1 | 11/2017 | Chen et al. |
| 2018/0013062 | A1 | 1/2018 | Reid et al. |
| 2018/0019394 | A1 | 1/2018 | Reid et al. |
| 2018/0047897 | A1 | 2/2018 | Reid et al. |
| 2018/0047900 | A1* | 2/2018 | Reid ..................... H01L 49/003 |
| 2018/0053892 | A1* | 2/2018 | Reid ..................... H01L 45/146 |
| 2018/0096713 | A1 | 4/2018 | Chandra et al. |
| 2018/0159028 | A1 | 6/2018 | Shifren et al. |
| 2018/0159029 | A1 | 6/2018 | Paz De Araujo et al. |
| 2018/0159031 | A1* | 6/2018 | Paz de Araujo ...... H01L 27/249 |
| 2018/0175290 | A1 | 6/2018 | Reid et al. |
| 2018/0212146 | A1* | 7/2018 | Shifren ................... H01L 45/04 |
| 2019/0296231 | A1 | 9/2019 | He et al. |
| 2019/0296236 | A1 | 9/2019 | He et al. |

OTHER PUBLICATIONS

Filing Receipt for U.S. Appl. No. 16/271,377, filed Feb. 8, 2019, dated Mar. 12, 2019, 3 Pages.
Notice to File Corrected Application Papers for U.S. Appl. No. 16/271,377, filed Feb. 8, 2019, dated Mar. 12, 2019, 2 Pages.
Response to Notice to File Corrected Application Papers for U.S. Appl. No. 16/271,377, filed May 9, 2019, 97 Pages.
Updated Filing Receipt for U.S. Appl. No. 16/271,377, filed Feb. 8, 2019, dated May 13, 2019, 3 Pages.
Restriction Requirement for U.S. Appl. No. 16/271,377, filed Feb. 8, 2019, dated Oct. 2, 2019, 8 Pages.
U.S. Appl. No. 16/163,190, filed Oct. 17, 2018, 82 Pages.
Filing Receipt for U.S. Appl. No. 16/163,190, filed Oct. 17, 2018, dated Nov. 7, 2018, 3 Pages.
Office Action for U.S. Appl. No. 16/163,190, filed Oct. 17, 2018, dated Oct. 7, 2019, 17 Pages.
U.S. Appl. No. 16/163,246, filed Oct. 17, 2018, 87 Pages.
Filing Receipt for U.S. Appl. No. 16/163,246, filed Oct. 17, 2018, dated Nov. 7, 2018, 3 Pages.
U.S. Appl. No. 16/206,725, filed Nov. 30, 2018, 101 Pages.
Filing Receipt for U.S. Appl. No. 16/206,725, filed Nov. 30, 2018, dated Dec. 20, 2018, 3 Pages.
U.S. Appl. No. 16/057,515, filed Aug. 7, 2018, 70 Pages.
Filing Receipt for U.S. Appl. No. 16/057,515, filed Aug. 7, 2018, dated Sep. 20, 2018, 3 Pages.
Informational Notice to Applicant for U.S. Appl. No. 16/057,515, filed Aug. 7, 2018, dated Sep. 20, 2018, 1 Page.
Response to Informational Notice to Applicant for U.S. Appl. No. 16/057,515, filed Nov. 29, 2018, 17 Pages.
Office Action for U.S. Appl. No. 16/057,515, filed Aug. 7, 2018, dated Jun. 5, 2019, 145 Pages.
Response to Office Action for U.S. Appl. No. 16/057,515, filed Sep. 5, 2019, 21 Pages.
Notice of Allowance for U.S. Appl. No. 16/057,515, filed Aug. 7, 2018, dated Oct. 15, 2019, 8 Pages.
Notification of Transmittal of the International Search Report and the Written Opinion of the International Searching Authority, or the Declaration, App. No. PCT/GB2019/050559, Filed Feb. 28, 2019, dated Jun. 11, 2019, 1 Page.
International Search Report, App. No. PCT/GB2019/050559, Filed Feb. 28, 2019, dated Jun. 11, 2019, 6 Pages.
Written Opinion of the International Searching Authority, App. No. PCT/GB2019/050559, Filed Feb. 28, 2019, dated Jun. 11, 2019, 17 Pages.
Notification of Transmittal of the International Search Report and the Written Opinion of the International Searching Authority, or Declaration, App. No. PCT/GB2019/050479, Filed Feb. 21, 2019, dated Oct. 22, 2019, 1 Page.
International Search Report, App. No. PCT/GB2019/050479, Filed Feb. 21, 2019, dated Oct. 22, 2019, 6 Pages.
Written Opinion of the International Searching Authority, App. No. PCT/GB2019/050479, Filed Feb. 21, 2019, dated Oct. 22, 2019, 10 Pages.
Notification of Transmittal of the International Search Report and the Written Opinion of the International Searching Authority, or Declaration, App. No. PCT/GB2019/050562, Filed Feb. 28, 2019, dated Jun. 17, 2019, 1 Page.
International Search Report, App. No. PCT/GB2019/050562, Filed Feb. 28, 2019, dated Jun. 17, 2019, 6 Pages.
Written Opinion of the International Searching Authority, App. No. PCT/GB2019/050562, Filed Feb. 28, 2019, dated Jun. 17, 2019, 13 Pages.
Notification of Transmittal of the International Search Report and the Written Opinion of the International Searching Authority, or the Declaration, App. No. PCT/GB2019/053257 Filed Nov. 15, 2019, dated Jan. 27, 2020, 1 Page.
International Search Report, App. No. PCT/GB2019/053257 Filed Nov. 15, 2019, dated Jan. 27, 2020, 5 Pages.
Written Opinion of the International Searching Authority, App. No. PCT/GB2019/053257 Filed Nov. 15, 2019, dated Jan. 27, 2020, 12 Pages.

* cited by examiner

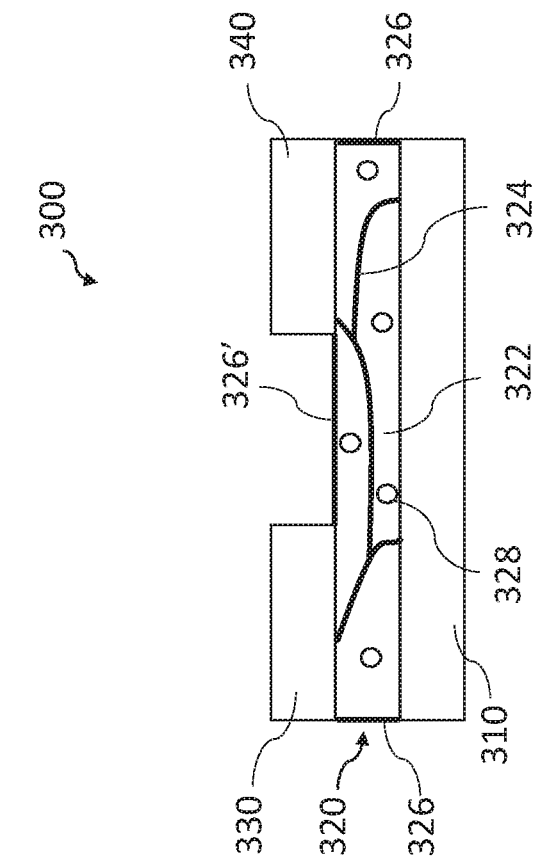
Fig. 3 Horizontal structure
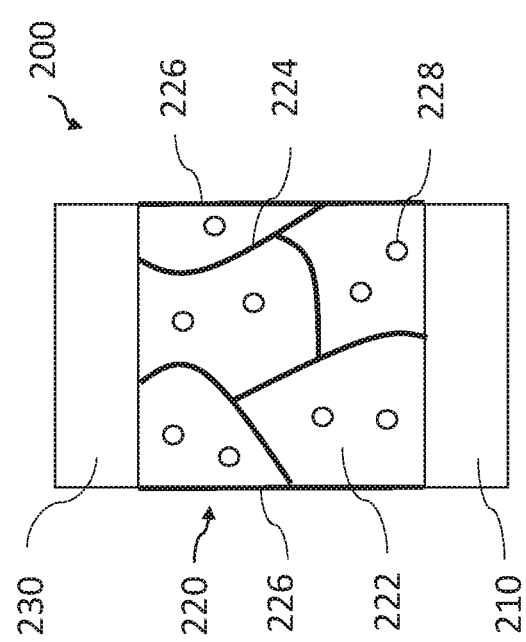
Fig. 2 Vertical structure

METHODS FOR CONTROLLING SWITCHING CHARACTERISTICS OF A CORRELATED ELECTRON MATERIAL DEVICE

BACKGROUND

The present disclosure is concerned with methods for controlling the switching characteristics of a correlated electron material (CEM) device as well as with CEM devices having controlled switching characteristics.

Electronic switching devices are found in a wide variety of electronic device types, such as computers, digital cameras, cellular telephones, tablet devices, personal digital assistants and so forth, where they may function as memory and/or logic devices.

DETAILED DESCRIPTION

Factors of interest to a designer in considering whether a particular electronic switching device is suitable for such a function, may include physical size, storage density, operating voltages, impedance ranges, and/or power consumption. Other factors of interest may include cost of manufacture, ease of manufacture, scalability and/or reliability.

There appears to be an ever-increasing drive towards memory and/or logic devices which can exhibit lower power and/or higher speed. Switching devices comprising a correlated electron material are at the forefront of this drive not just because they can exhibit low power and/or high speed but also because they are generally reliable and easily and cheaply manufactured.

The present disclosure provides methods for enhancing the switching characteristics of a CEM device as well as CEM devices having enhanced switching characteristics.

Claimed subject matter is particularly pointed out and distinctly claimed in the concluding portion of the specification. However, both as to organization and/or method of operation, together with objects, features and advantages thereof it may be best understood by reference to the following detailed description and the accompanying drawings in which:

FIG. 2 is an illustration of an embodiment of a switching device comprising a polycrystalline correlated electron material;

FIG. 3 is an illustration of another embodiment of a switching device comprising a polycrystalline correlated electron material;

Figure 1A:
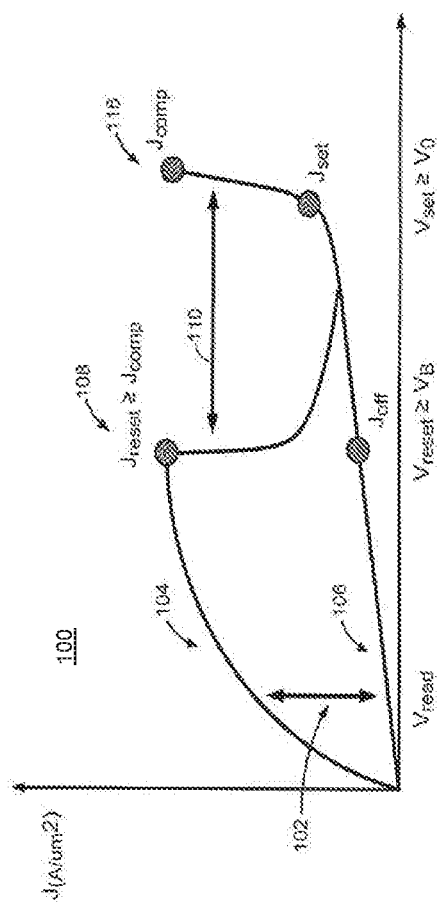
FIG. 1A is an illustration of a current density against voltage profile of an embodiment of a switching device comprising a correlated electron material.
Figure 1C:
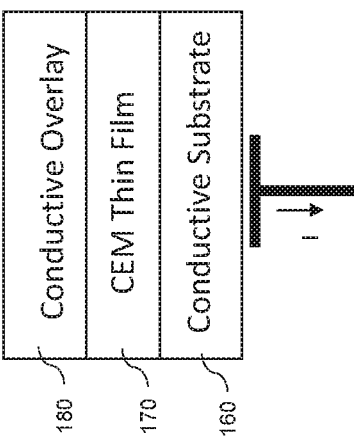
FIG. 1C is a schematic diagram of an equivalent circuit for an embodiment of a switching device comprising a correlated electron material.

The present disclosure provides methods and/or processes for preparing and/or fabricating correlated electron materials (CEMs) films to form, for example, a correlated electron switch such as may be used to form a correlated electron random access memory (CERAM) in memory and/or logic devices, for example. Correlated electron materials, which may be utilized in the construction of CERAM devices and CEM switches, may also comprise a wide range of other electronic circuit types such as, for example memory controllers, memory arrays, filter circuits, data converters, optical instruments, phase locked loop circuits, microwave and millimeter wave transceivers, and so forth.

In this context, a CEM switch, for example, may exhibit a substantially rapid conductor-to-insulator transition, which may be brought about by electron correlations rather than solid state structural phase changes, such as in response to a change from a crystalline to an amorphous state, for example, in a phase change memory device or, in another example, formation of filaments in resistive RAM devices.

The rapid conductor-to-insulator transition of a CEM device may be responsive to a quantum mechanical phenomenon in contrast to the melting/solidification or filament formation found respectively in phase change and resistive RAM devices. The quantum mechanical transition in a CEM device between a relatively conductive state and a relatively insulative state (or between a relatively lower impedance state and a relatively higher impedance state) may occur in several ways.

The quantum mechanical transition of a CEM between a relatively insulative/higher impedance state and a relatively conductive/lower impedance state (wherein the relatively conductive/lower impedance state is substantially dissimilar to the relatively insulative/higher impedance state) may be understood in terms of a Mott transition.

As used herein, references to a Mott transition are references to traditional Mott transitions (which are described in the literature as purely coulombic) as well as references to Mott-like transitions (in which the coulombic interaction is modified by some other electron interaction, such as a dipole-core charge interaction). Accordingly, a reference to a Mott insulator includes a reference to a charge-transfer (Mott) insulator, such as nickel (II) oxide, in which the columbic interaction or screening is modified by a charge transfer complex through hybridisation with the oxygen band.

In accordance with a Mott transition, a material may switch from a relatively insulative/higher impedance state to a relatively conductive/lower impedance state if a Mott transition condition is satisfied. The Mott criteria may be defined by $(n_c)^{1/3} a \approx 0.26$, wherein $n_c$ denotes a concentration of electrons, and wherein "a" denotes the Bohr radius. If a threshold carrier concentration is achieved, such that the Mott criteria is met, the Mott transition is believed to occur. Responsive to the Mott transition occurring, the state of the CEM device changes from a relatively higher resistance/higher capacitance state (e.g. an insulative/higher impedance state) to a relatively lower resistance/lower capacitance state (e.g. a conductive/lower impedance state).

The Mott transition may be controlled by a localization of electrons. If carriers, such as electrons, for example, are localized, a strong coulomb interaction between the carriers is believed to split the bands of the CEM to bring about a relatively insulative (relatively higher impedance) state. If electrons are no longer localized, a weak coulomb interaction may dominate, which may give rise to a removal of band splitting, which may, in turn, bring about a metal (conductive) band (relatively lower impedance state) that is substantially dissimilar from the relatively higher impedance state.

The switching from a relatively insulative/higher impedance state to a relatively conductive/lower impedance state may bring about a change in capacitance in addition to a change in resistance. For example, a CEM switch may exhibit a variable resistance together with a property of variable capacitance. In other words, impedance characteristics of a CEM switch may include both resistive and capacitive components. For example, in a metal state, a CEM switch may comprise a relatively low electric field that may approach zero, and therefore may exhibit a substantially low capacitance, which may likewise approach zero.

Similarly, in a relatively insulative/higher impedance state, which may be brought about by a higher density of bound or correlated electrons, an external electric field may be capable of penetrating the CEM and, therefore, the CEM may exhibit higher capacitance based, at least in part, on additional charges stored within the CEM. Thus, for example, a transition from a relatively insulative/higher impedance state to a relatively conductive/lower impedance state in a CEM switch may result in changes in both resistance and capacitance.

A switching device formed from a CEM may exhibit switching of impedance states responsive to a Mott-transition in a majority of the volume of the CEM comprising the device. The CEM may, in particular, form a "bulk switch". As used herein, the term "bulk switch" refers to at least a majority volume of a CEM switching a device's impedance state, such as in response to a Mott-transition. For example, substantially all CEM of a device may switch from a relatively insulative/higher impedance state to a relatively conductive/lower impedance state or from a relatively conductive/lower impedance state to a relatively insulative/higher impedance state responsive to a Mott-transition.

In embodiments, the CEM may comprise a compound of a d- or f-block element (especially one exhibiting an incomplete d- or f-shell) such as nickel, cobalt, iron, yttrium or ytterbium. The CEM may comprise an oxide of a d- or f-block element and, in particular, a transition metal oxide (TMO) such as nickel oxide, cobalt oxide, hafnium oxide, iron oxide, a post transition metal oxide, such as indium oxide or gallium oxide or bismuth oxide or an oxide of a rare earth element, such as yttrium oxide. The CEM may alternatively or additionally comprise a chalcogenide (including a mixed chalcogenide) of a d- or f-block element, and in particular, a transition metal chalcogenide, such as nickel sulfide or a post transition metal chalcogenide such as bismuth selenide or bismuth telluride.

The CEM may also comprise a complex (or "mixed") oxide of d- and/or f-block elements, such as a perovskite, for example, chromium doped strontium titanate, lanthanum titanate, praseodymium calcium manganate or praseodymium lanthanum manganate or a complex oxide of a rare earth element and a transition metal such as yttrium titanium oxide or ytterbium titanium oxide.

The CEM may comprise a metal compound of general formula AB:Lx (for example, Ni:CO) wherein AB denotes, for example, a transition metal compound such as a transition metal oxide or chalcogenide, or a post transition metal oxide or chalcogenide, and Lx denotes an extrinsic ligand for the metal with x indicating the number of units of the extrinsic ligand for one unit of the transition metal or transition metal compound. The value of x for any specific ligand and any specific combination of ligand with a metal compound such as a transition metal oxide may be determined by balancing valences.

Figure 1B:
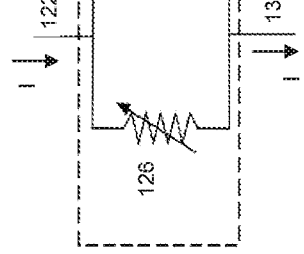
FIG. 1B is an illustration of an embodiment of a switching device comprising a correlated electron material.

In one arrangement, shown in FIG. 1B, a CEM switching 150 device may comprise a layer of correlated electron material 170 (a CEM layer) sandwiched between a conductive substrate 160 and a conductive overlay 180. In this arrangement, the CEM switching device can act as memory storage element.

In other arrangements, the CEM switching device may comprise either a CEM layer provided on a conductive substrate or a CEM layer provided with one or more of a conductive overlay. In these arrangements, the device may comprise source and a drain regions providing for a flow of current across the device.

Referring now to FIG. 1A, a current density against voltage profile 100 of a CEM switching device is shown which illustrates its switching behaviour. Based, at least in part, on a voltage applied to terminals of a CEM device, for example, during a "write operation," the CEM device may be placed into a relatively low-impedance state or a relatively high-impedance state. For example, application of a voltage $V_{set}$ and a current density $J_{set}$ may bring about a transition of the CEM switching device to a relatively low-impedance memory state. Conversely, application of a voltage $V_{reset}$ and a current density $J_{reset}$ may bring about a transition of the CEM device to a relatively high-impedance memory state.

As shown in FIG. 1A, reference designator 110 illustrates the voltage range that may separate $V_{set}$ from $V_{reset}$. Following placement of the CEM switching device into a high-impedance state or a low-impedance state, the particular state of the CEM switching device may be detected by application of a voltage $V_{rea}d$ (e.g., during a read operation) and detection of a current or current density at terminals of the CEM switching device (e.g., utilizing read window 102).

In accordance with FIG. 1A, if sufficient bias is applied (e.g., exceeding a band-splitting potential) and the aforementioned Mott condition is satisfied (e.g., injected electron holes are of a population comparable to a population of electrons in a switching region, for example), a CEM switching device may switch from a relatively low-impedance state to a relatively high-impedance state, for example, responsive to a Mott transition. This may correspond to point 108 of the voltage versus current density profile of FIG. 1A. At, or suitably nearby this point, electrons are no longer screened and become localized near the metal ion. This correlation may result in a strong electron-to-electron interaction potential which may operate to split the bands to form a relatively high-impedance material.

If the CEM switching device comprises a relatively high-impedance state, current may be generated by transportation of electron holes. Consequently, if a threshold voltage is applied across terminals of the CEM device, electrons may be injected into a metal-insulator-metal (MIM) diode over the potential barrier of the MIM device. In certain devices, injection of a threshold current of electrons, at a threshold potential applied across terminals of a CEM device, may perform a "set" operation, which places the CEM device into a low-impedance state. In a low-impedance state, an increase in electrons may screen incoming electrons and remove a localization of electrons, which may operate to collapse the band-splitting potential, thereby giving rise to the low-impedance state.

A current in a CEM switching device may be controlled by an externally applied "compliance" condition, which may be determined at least partially on the basis of an applied external current, which may be limited during a write operation, for example, to place the CEM device into a relatively low-impedance state. This externally applied compliance current may, in some devices, also set a condition of a current density for a subsequent reset operation to place the CEM device into a relatively high-impedance state. As shown in the particular device of FIG. 1A, a current density $J_{comp}$ applied during a write operation at point 116 to place the CEM switching device into a relatively low-impedance state, may determine a compliance condition for placing the CEM device into a high-impedance state in a subsequent write operation. As shown in FIG. 1A, the CEM device may be subsequently placed into a high-impedance state by application of a current density $J_{reset}$ at a voltage $V_{reset}$ at point 108.

The compliance condition may, in particular, set a number of electrons in a CEM switching device which may be "captured" by holes for the Mott transition. In other words, a current applied in a write operation to place a CEM device into a relatively low-impedance memory state may determine a number of holes to be injected to the CEM device for subsequently transitioning the CEM switching device to a relatively high-impedance memory state.

As pointed out above, a reset condition may occur in response to a Mott transition at point 108. Such a Mott transition may bring about a condition in the CEM switching device in which a concentration of electrons n approximately equals, or becomes at least comparable to, a concentration of electron holes p. This condition may be modeled according to expression (1) as follows:

$$\lambda_{TF} n^{\frac{1}{3}} = C \sim 0.26 \qquad (1)$$

$$n = \left(\frac{C}{\lambda_{TF}}\right)^3$$

wherein $\lambda_{TF}$ corresponds to a Thomas Fermi screening length, and C is a constant.

A current or current density in region 104 of the voltage against current density profile shown in FIG. 1A, may exist in response to injection of holes or extraction of electrons from a voltage signal applied across terminals of the CEM switching device. Here, injection of holes or extraction of electrons may meet a Mott transition criterion for the low-impedance state to high-impedance state transition at current $I_{MI}$ as a threshold voltage $V_{MI}$ is applied across terminals of a CEM device. This may be modeled according to expression (2) as follows:

$$I_{MI}(V_{MI}) = \frac{dQ(V_{MI})}{dt} \approx \frac{Q(V_{MI})}{t} \qquad (2)$$

$$Q(V_{MI}) = qn(V_{MI})$$

wherein $Q(V_{MI})$ corresponds to the charged injected (holes or electrons) and is a function of an applied voltage. Injection or extraction of electrons and/or holes to enable a Mott transition may occur between bands and in response to threshold voltage $V_{MI}$, and threshold current $I_{MI}$. By equating electron concentration n with a charge concentration to bring about a Mott transition by holes injected by $I_{MI}$ in expression (2) according to expression (1), a dependency of such a threshold voltage $V_{MI}$ on Thomas Fermi screening length $\lambda_{TF}$ may be modeled according to expression (3), as follows:

$$I_{MI}(V_{MI}) = \frac{Q(V_{MI})}{t} = \frac{qn(V_{MI})}{t} = \frac{q}{t}\left(\frac{C}{\lambda_{TF}}\right)^3 \qquad (3)$$

$$J_{reset}(V_{MI}) = J_{MI}(V_{MI}) = \frac{I_{MI}(V_{MI})}{A_{CEM}} = \frac{q}{A_{CEM} t}\left(\frac{c}{\lambda_{TF}}\right)^3$$

wherein $A_{CEM}$ is a cross-sectional area of a CEM switching device; and $J_{reset}(V_{MI})$ may represent a current density through the CEM switching device to be applied to the CEM switching device at a threshold voltage $V_{MI}$, which may place the CEM switching device into a relatively high-impedance state.

The CEM switching device may be placed into a relatively low-impedance memory state, such as by transitioning from a relatively high impedance state, for example, via injection of a sufficient quantity of electrons to satisfy a Mott transition criterion. In transitioning a CEM switching device to a relatively low-impedance state, if enough electrons are injected and the potential across the terminals of the CEM device overcomes a threshold switching potential (e.g., $V_{set}$), injected electrons may begin to screen. As previously mentioned, screening may operate to delocalize double-occupied electrons to collapse the band-splitting potential, thereby bringing about a relatively low-impedance state.

In particular embodiments, changes in impedance states of CEM devices, such as changes from a low-impedance state to a substantially dissimilar high-impedance state, for example, may be brought about by a reversible "back-donation" of electrons of compounds comprising $Ni_xO_y$, (wherein the subscripts "x" and "y" comprise whole numbers). As the term is used herein, "back-donation" refers to a supplying of one or more electrons (i.e. electron density) to a d- or f-block metal compound, such as a transition metal oxide, post transition metal oxide or post transition metal chalcogenide, or any combination thereof (e.g., to an atomic orbital of a d- or f-block metal), by an adjacent molecule of a lattice structure (i.e. a ligand), and at the same time donation of electron density from the metal center into an unoccupied antibonding orbital on the ligand/dopant.

The electron back-donating ligand may be a n-back-bonding ligand such as carbonyl (CO), nitrosyl (NO), an isocyanide (RNC where R is H, $C_1$-$C_6$ alkyl or $C_6$-$C_{10}$-aryl), an alkene (e.g. ethene), an alkyne (e.g. ethyne) or a phosphine such as a trialkyl phosphine or a triaryl phosphine ($R_3P$ wherein R is H, $C_1$-$C_6$-alkyl or $C_6$-$C_{10}$-aryl), for example triphenylphosphine ($PPh_3$).

In embodiments, the CEM comprises doped nickel oxide, such as $NiO:L_x$, wherein the dopant comprising a back-donating ligand comprises a molecule of the form $C_aH_bN_dO_f$ (in which a≥1, and b, d and f≥0) such as: carbonyl (CO), cyano ($CN^-$), ethylenediamine ($C_2H_8N_2$), 1, 10-phenanthroline ($C_{12}H_8N_2$), bipyridine ($C_{10}H_8N_2$), pyridine ($C_5H_5N$), acetonitrile ($CH_3CN$) and cyanosulfanides such as thiocyanate ($NCS^-$).

Back-donation may permit a transition metal, transition metal compound, transition metal oxide, or a combination thereof, to maintain an ionization state that is favorable to electrical conduction under an influence of an applied voltage. In certain embodiments, back-donation in a CEM, for example, may occur responsive to use of carbonyl (CO) or a nitrogen-containing dopant, such as ammonia ($NH_3$), ethylene diamine ($C_2H_8N_2$), or members of an oxynitride family ($N_xO_y$), for example, which may permit a CEM to exhibit a property in which electrons are controllably, and reversibly, "donated" to a conduction band of the transition metal or transition metal oxide, such as nickel, for example, during operation of a device or circuit comprising a CEM. Back donation may be reversed, for example, in nickel oxide material (e.g., NiO:CO or NiO:NH$_3$), thereby permitting the nickel oxide material to switch to exhibiting a substantially dissimilar impedance property, such as a high-impedance property, during device operation.

Thus, in this context, an electron back-donating material refers to a material that exhibits an impedance switching property, such as switching from a first impedance state to a substantially dissimilar second impedance state (e.g., from a relatively low impedance state to a relatively high impedance state, or vice versa) based, at least in part, on influence of an applied voltage to control donation of electrons, and reversal of the electron donation, to and from a conduction band of the CEM.

In some embodiments, by way of back-donation, a CEM switch comprising, for example, a metal oxide or metal chalcogenide, may exhibit low-impedance properties if the transition metal, such as nickel, for example, is placed into an oxidation state of 2+ (e.g., Ni$^{2+}$ in a material, such as NiO:CO or NiO:NH$_3$). Conversely, electron back-donation may be reversed if a transition metal, such as nickel, for example, is placed into an oxidation state of 1+ or 3+.

Accordingly, during operation of a CEM device, back-donation may result in "disproportionation," which may comprise substantially simultaneous oxidation and reduction reactions, substantially in accordance with expression (4), below:

$$2Ni^{2+} \rightarrow Ni^{1+} + Ni^{3+} \quad (4)$$

Such disproportionation, in this instance, refers to formation of nickel ions as Ni$^{1+}$+Ni$^{3+}$ as shown in expression (4), which may bring about, for example, a relatively high-impedance state during operation of the CEM device. In an embodiment, a dopant such as a carbon-containing ligand, carbonyl (CO) or a nitrogen-containing ligand, such as an ammonia molecule (NH$_3$), may permit sharing of electrons during operation of a CEM device so as to give rise to the disproportionation reaction of expression (4), and its reversal, substantially in accordance with expression (5), below:

$$Ni^{1+} + Ni^{3+} \rightarrow 2Ni^{2+} \quad (5)$$

As previously mentioned, reversal of the disproportionation reaction, as shown in expression (5), permits nickel-based CEM to return to a relatively low-impedance state.

In embodiments, depending on a molecular concentration of NiO:CO or NiO:NH$_3$, for example, which may vary from values approximately in the range of an atomic concentration of 0.1% to 30.0%, for example, between 0.1% and 15.0% or 0.1% and 10.0%, V$_{reset}$ and V$_{set}$, as shown in FIG. 1A, may vary approximately in the range of 0.1 V to 10.0 V subject to the condition that V$_{set}$≥V$_{reset}$. For example, in one possible embodiment, V$_{reset}$ may occur at a voltage approximately in the range of 0.1 V to 1.0 V, and V$_{set}$ may occur at a voltage approximately in the range of 1.0 V to 2.0 V, for example. It should be noted, however, that variations in V$_{set}$ and V$_{reset}$ may occur based, at least in part, on a variety of factors, such as atomic concentration of an electron back-donating material, such as NiO:CO or NiO:NH$_3$ and other materials present in the CEM device, as well as other process variations.

The CEM layer may be formed by a variety of methods discussed below. It may, in particular, be formed by a physical vapour deposition, such as reactive sputtering, of a transition metal compound, for example, a transition metal oxide, in an atmosphere of a gaseous oxide, providing an extrinsic ligand for the transition metal oxide, such as carbon monoxide (CO).

The CEM layer may alternatively be formed by a chemical vapour deposition, such as an atomic layer deposition (ALD), of a transition or post transition metal compound, for example, a transition metal oxide.

The atomic layer deposition may form the layer utilising separate precursor molecules AX and BY, according to the expression (6) below:

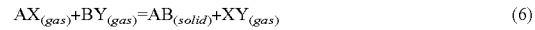

$$AX_{(gas)} + BY_{(gas)} = AB_{(solid)} + XY_{(gas)} \quad (6)$$

wherein "A" of expression (4) corresponds to the transition metal, and "AB" a transition metal compound, such as a transition metal oxide.

The "X" of expression (4) may comprise one or more of an organic or other ligand, such as amidinate (AMD), cyclopentadienyl (Cp), bis(ethylcylcopentadienyl) ((EtCp)$_2$), bis(pentamethylcyclo-pentadienyl) (C$_5$(CH$_3$)$_5$)$_2$bis(2,2,6,6-tetramethylheptane-3,5-dionato) ((thd)$_2$), acetylacetonato (acac), bis(methylcyclopentadienyl) ((MeCp)$_2$), dimethylglyoximato (dmg)$_2$, (apo)$_2$ where apo is 2-amino-pent-2-ene-4-onato, (dmamb)$_2$ where dmamb is 1-dimethylamino-2-methyl-2-butanolato, (dmamp)$_2$ where dmamp is 1-dimethylamino-2-methyl-2-propanolato.

Suitable precursor molecules AX include organometallic compounds of the transition metals having one or more of these ligands alone or in combination together with other ligands.

Accordingly, in some embodiments, a nickel based precursor AX (NiX) may comprise, for example, nickel amidinate (Ni(AMD)), bis(cyclopentadienyl)nickel (Ni(Cp)$_2$), nickel acetoacetonate (Ni(acac)$_2$), nickel dimethylglyoximate (Ni(dmg)$_2$), bis(ethylcyclo-pentadienyl)nickel (Ni(EtCp)$_2$), bis(methylcyclopentadienyl)nickel (Ni(CH$_3$C$_5$H$_4$)$_2$), bis(pentamethylcyclopentadienyl)nickel (Ni(C$_5$(CH$_3$)$_5$)$_2$), nickel 2-amino-pent-2-en-4-anato (Ni(apo)$_2$), Ni(dmamb)$_2$ where dmamb is 1-dimethylamino-2-methyl-2-butanolato, Ni(dmamp)$_2$ where dmamp is 1-dimethyl-amino-2-methyl-2-propanolato.

The precursor "BY" in expression (4) may comprise a gaseous oxide (as an oxidant), such as water (H$_2$O), oxygen (O$_2$), ozone (O$_3$), nitric oxide (NO), nitrous oxide (N$_2$O) hydrogen peroxide (H$_2$O$_2$) or plasma-formed oxygen radical (O.).

In other embodiments, the method may form the CEM layer utilizing precursors AX and BY and an additional dopant precursor. The additional dopant precursor may comprise ammonia (NH$_3$), methane (CH$_4$), carbon monoxide (CO) or any other molecule providing a back donating dopant in the metal compound and may co-flow with precursor AX. In that case, the CEM layer is formed according to the expression (5) may be modified to include an additional dopant ligand comprising a back-donating material substantially in accordance with expression (5), below:

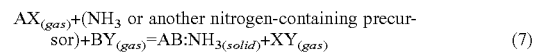

$$AX_{(gas)} + (NH_3 \text{ or another nitrogen-containing precursor}) + BY_{(gas)} = AB:NH_{3(solid)} + XY_{(gas)} \quad (7)$$

In expression (7), "BY" may comprise an oxidising agent, such as oxygen (O$_2$), ozone (O$_3$), nitric oxide (NO), hydrogen peroxide (H$_2$O$_2$) or plasma-formed oxygen radical (O.). In that case, the transition metal compound "AB" in expression (5) may be a transition metal oxide, such as nickel oxide (NiO:NH$_3$). Note that a plasma may also be used with the dopant precursor to form an activated dopant species providing for control of the concentration of the dopant in the CEM layer.

In one such embodiment, the method may form a CEM layer comprising nickel oxide doped with a carbon-containing and/or nitrogen-containing dopant (NiO:NH$_3$, for example) by an atomic layer deposition within a chamber heated to a temperature within the range 20.0° C. and 400.0° C. with exposure of the precursor gases (AX, BY, NH$_3$ or other ligand comprising nitrogen) for durations in the range of about 0.1 second and 300 seconds and purging of the precursors for durations in the range of about 0.5 seconds to 180.0 seconds.

In certain embodiments, a single atomic layer deposition two-precursor cycle (e.g., AX and BY, as described with reference to expression (4)) or a single three-precursor cycle (e.g., AX, NH$_3$, CH$_4$, or other ligand comprising nitrogen, carbon or other dopant comprising a back-donating material, and BY), as described with reference to expression (5) may bring about a CEM layer comprising a thickness approximately in the range of 0.6 Å to 5.0 Å per cycle.

Accordingly, the method may comprise forming a CEM layer of thickness of approximately 500.0 Å by 800-900 two-precursor cycles of an atomic layer deposition process forming a layer of thickness approximately 0.6 Å per cycle. Alternatively, the method may form a CEM layer of thickness approximately 500.0 Å by 100 two-precursor cycles of an atomic layer deposition process forming a layer of thickness approximately 5.0 Å per cycle.

Note, however, that the method may form a CEM layer of any suitable thickness and, in particular, a CEM layer having a thickness between 1.5 nm and 150.0 nm by an atomic layer or other deposition.

In a particular embodiment, the method may form the CEM layer by a two-precursor (for example, AX and BY) or a three-precursor (for example, AX, NH$_3$, CH$_4$ or another dopant precursor and BY) atomic layer deposition and an in situ annealing. The in situ annealing may permit an improvement of layer properties or the incorporation of dopant. It may be carried at temperatures between 20.0° C. and 1000.0° C. and in some embodiments at temperatures between 50.0° C. and 800.0° C. The duration of annealing may be between 1.0 second and 5.0 hours but in some embodiments, it may be between 0.5 minutes and 180.0 minutes.

In a particular embodiment, the method may form the CEM layer by spin coating a layer of a precursor (such as AX) from a solution and annealing the layer in an atmosphere comprising an oxidising agent, such as water (H$_2$O), oxygen (O$_2$), ozone (O$_3$) at a temperature between 30° C. to 500° C. and, in particular, at a temperature between 100° C. and 400° C. The duration of annealing may be between 1.0 second and 5.0 hours and, in particular, 0.5 minutes and 180.0 minutes.

In embodiments, the CEM layer comprises a doped metal compound wherein the content of carbon or nitrogen (for example) is between 1 atom % and 30 atom %, in particular, between 5 atom % and 30 atom %, for example, 10 atom % or 15 atom % or 20 atom %. In one such embodiment, wherein the CEM layer is a doped nickel oxide (NiO: dopant) the carbon content may derive from carbon monoxide gas or from a carbonyl (—CO) ligand in an organometallic precursor.

In particular embodiments, a CEM device fabricated in accordance with the above-described process may exhibit a "born on" property in which the device exhibits relatively low impedance (relatively high conductance) immediately after fabrication of the device. Accordingly, if a CEM device is integrated into a larger electronics environment, for example, at initial activation a relatively small voltage applied to a CEM device may permit a relatively high current to flow through the CEM device as shown by region 104 in FIG. 1A. For example, as previously described herein, in at least one possible embodiment, V$_{reset}$ may occur at a voltage approximately in the range 0.1 V to 1.0 V and V$_{set}$ may occur at a voltage approximately in the range of 1.0 V to 2.0 V, for example. Electrical switching voltages operating in a range of approximately 2.0 V or less may permit a memory circuit, for example, to write to a CERAM memory device, to read from a CERAM memory device, or to change state of a CERAM switch for example. In embodiments, such relatively low voltage operation may reduce complexity and cost, and may provide other advantages over competing memory and/or switching device technologies.

The conductive substrate and/or the conductive overlay may comprise any suitable material and may be formed by any suitable method. The conductive substrate and/or the conductive overlay may, in particular, comprise a noble metal and/or a conductive metal nitride.

The conductive substrate and/or the conductive overlay may be selected from one or more of titanium nitride, tantalum nitride, tungsten nitride, platinum, titanium, copper, aluminium, cobalt, nickel, tungsten, cobalt silicide, ruthenium, ruthenium oxide, rhodium, osmium, chromium, gold, palladium, indium tin oxide, tantalum, silver, iridium, and iridium oxide.

In certain embodiments, the conductive overlay and/or the conductive substrate comprise a major (bulk) layer comprising a conductive metal nitride and a minor layer comprising a noble metal or other conductive material.

Accordingly, the conductive substrate may be formed by depositing a first layer of a metal nitride and depositing a second layer of a noble metal or other conductive material on the first layer. And the conductive overlay may be formed by depositing a first layer of a noble metal or other conductive material and depositing a second layer of a metal nitride on the first layer.

The metal nitride may comprise one or more of titanium nitride, tantalum nitride, and tungsten nitride. The noble metal or other conductive material may comprise platinum, titanium, copper, aluminium, cobalt, nickel, tungsten, cobalt silicide, ruthenium oxide, chromium, gold, palladium, indium tin oxide, tantalum, silver, iridium, iridium oxide or any combination thereof.

The underlying substrate upon which the CEM device is formed may comprise an insulating material, such as silica, provided on an underlying dielectric material, which includes a via for contacting the conductive substrate with a metal interconnect in the dielectric material. A moisture barrier layer (for example, of silicon nitride (Si$_3$N$_4$), silicon carbon nitride (SiCN) or silicon carbide (SiC)) may be provided between the insulating and dielectric materials.

In one embodiment, the substrate comprises a fluorosilicate glass (FSG) plate including a via for contacting the conductive substrate with a copper interconnect in an underlying dielectric material. A moisture barrier layer comprising silicon nitride (Si$_3$N$_4$) may be provided between the dielectric material and the glass plate.

FIG. 1B shows a CEM switching device 150 comprising a CEM layer 170 sandwiched between a conductive substrate 160 and a conductive overlay 180 and a schematic diagram of an equivalent circuit for the switching device.

As previously mentioned, the CEM switching device may exhibit characteristics of both variable resistance and variable capacitance. In other words, the CEM switching device may be considered as a variable impedance device in which the impedance depends at least in part on resistance and capacitance characteristics of the device if measured across device terminals 122 and 130. The equivalent circuit for a variable impedance device may comprise a variable resistor 126, such as variable resistor, in parallel with a variable capacitor 128. Of course, although a variable resistor and variable capacitor are depicted in FIG. 1B as comprising discrete components, the variable impedance device, such as that shown, may comprise a substantially homogenous CEM.

Table 1 illustrates an example truth table for an example variable impedance device, such as the device of FIG. 1A.

Table 1 shows that a resistance of a variable impedance device, such as that shown, may transition between a low-impedance state and a substantially dissimilar, high-impedance state as a function at least partially dependent on a voltage applied across the CEM switching device 150.

TABLE 1

Correlated Electron Switch Truth Table

| Resistance | Capacitance | Impedance |
|---|---|---|
| $R_{high}(V_{applied})$ | $C_{high}(V_{applied})$ | $Z_{high}(V_{applied})$ |
| $R_{low}(V_{applied})$ | $C_{low}(V_{applied}) \sim 0$ | $Z_{low}(V_{applied})$ |

The impedance exhibited at a low-impedance state may, for example, be approximately in the range of 10.0-100,000.0 times lower than an impedance exhibited in a high-impedance state. However, the impedance exhibited at a low-impedance state may be approximately in the range of 5.0 to 10.0 times lower than an impedance exhibited in a high-impedance state. Table 1 also shows that a capacitance of a variable impedance device, such as the device shown, may transition between a lower capacitance state, which may, for example comprise an approximately zero, or very little, capacitance, and a higher capacitance state that is a function, at least in part, of a voltage applied across the CEM device.

The present methods comprise controlling the switching characteristics of a CEM device by controlling the internal surface area (viz. the morphology and nanostructure) of the CEM layer during the manufacture and/or by selecting the surface area of the CEM layer exposed to air in the finished CEM device.

The selection of exposed surface area of the CEM layer may comprise selecting a configuration for the CEM device. The selection of configuration may comprise selecting an arrangement of the various components for the device and/or selecting dimensions of the components.

In one embodiment, the configuration comprises a vertical arrangement for the CEM device in which the CEM layer is provided on or over a conductive substrate and a conductive overlay is provided on or over the CEM layer. In this (vertical) configuration, the exposed surface area of the CEM layer comprises the sidewalls of the CEM layer.

In this embodiment, further control over the switching characteristics for the device may be achieved by selecting a thickness for the CEM layer (viz. a height for the sidewalls of the CEM layer).

FIG. 2 shows a CEM switching device in one such vertical configuration. The CEM switching device 200 comprises a conductive substrate 210, a CEM layer 220 and a conductive overlay 230. The CEM layer 220 is sandwiched between the conductive substrate 210 and the conductive overlay 230.

The sidewalls 226 of the CEM layer 220 define an exposed surface area (viz. an area of a surface which interfaces with air) for the CEM layer 220.

In another embodiment, the selection comprises selecting a horizontal arrangement for the CEM device in which the CEM layer is provided on or over an insulating substrate and one or more a conductive overlay is provided on or over part of the CEM layer. In this (horizontal) configuration, the exposed surface area of the CEM layer comprises an upper surface of the CEM layer which is not overlaid by the one or more the conductive overlay.

In this embodiment, further control may be achieved by selecting a width or cross-sectional area for the one or more of a conductive overlay (viz. a width or cross-sectional area for a part of the CEM layer which is not overlaid).

FIG. 3 shows one such horizontal configuration. The CEM switching device 300 comprises an insulating substrate 310, a CEM layer 320, a first conductive overlay 330 and a second conductive overlay 340. The CEM layer 320 is arranged on the insulating substrate 300 and the conductive overlays 330 and 340 are arranged on the CEM layer 320.

The sidewalls 326 (and the upper surface 326' of the CEM layer 320 between the conductive overlays 330 and 340) define an external surface area (viz. an area of a surface which interfaces with air) for the CEM layer 320.

It will be seen, therefore, that the exposed surface area of the CEM layer in the vertical device 220 may differ considerably from the exposed surface area of the horizontal device 320.

Note that in these configurations, the CEM device may have any suitable shape. It may, in particular, be rectilinear, trapezoidal or circular in shape.

The control of the internal surface area of the CEM layer may comprise selecting a deposition process, amongst different deposition processes, for depositing the CEM layer.

The morphology and nanostructure of a CEM layer may be significantly different for a CEM layer deposited by one deposition process (for example, chemical vapor deposition) as compared to that for a CEM layer deposited by another deposition process (for example, physical vapor deposition).

The selection of the deposition process may provide, for example, that the CEM layer is wholly amorphous or wholly polycrystalline. Of course, it may provide that the CEM layer is partly amorphous with the remainder of the CEM layer being polycrystalline.

In embodiments, further control over the internal surface area of the CEM layer may be achieved by selecting one or more deposition process parameters, such as deposition rate, flow rate of reactant gases, partial pressure of reactant gases, chamber temperature, ambient temperature, and, ambient pressure to control a density of grain boundaries in the CEM layer and/or an open pore porosity in the CEM layer.

FIG. 2 shows a polycrystalline CEM layer 220 in which the size of the polycrystals or "grains" 222 are greatly exaggerated. As may be seen, the grains 222 define grain boundaries 224 which together with porous holes 228 (air gaps or "voids") within the grains and/or at grain boundaries define an internal surface area for the CEM layer 220.

FIG. 3 also shows a polycrystalline CEM layer 320 in which the size of the polycrystals or "grains" 322 are greatly exaggerated. The grains 322 define grain boundaries 324 which together with porous holes 328 (air gaps or "voids") within the grains and/or at grain boundaries define an internal surface area for the CEM layer 320.

It will be seen that, at least for similar grain sizes, the internal surface area of the CEM layer in the vertical device 220 may differ considerably from the internal surface area of the horizontal device 320.

While the deposition process conditions may generally provide for a semi-polycrystalline or polycrystalline CEM layer 220, they may be altered to control, for example, the size of the grains 222 and/or the distribution of differently sized grains 222 deposited in the CEM layer 220.

The deposition process conditions may, for example, provide a CEM layer 220 comprising relatively small grains 222. Alternatively, the deposition process conditions may provide a CEM layer 220 comprising relatively large grains in the CEM layer 220. In that case, the grains 222 may be orientated to a single direction as compared to relatively small crystals which are randomly orientated.

Of course, the deposition process may also use a conductive substrate 210 or an insulating substrate 310 which directs the crystal orientation of the CEM layer. The use of such substrates is well-known, for example, for the deposition of piezoelectric thin films in the manufacture of piezoelectric actuators, piezoelectric transducers and the like. Alternatively, the substrate may have a surface roughness promoting a random crystal orientation in the CEM layer.

The conductive substrate 210 or insulating substrate 310 may, for example, provide for columnar grain growth (vertical direction) or for extended grain growth (horizontal direction).

The conductive substrate 210 or insulating substrate 310 may comprise a composite structure of different material layers wherein an upper material layer provided on a lower material layer and is an orientation control layer for the CEM layer.

In any case, the deposition process may provide that the degree of crystal orientation of the CEM layer 220 is between 50% and 100%, for example, between 60% and 98%, 95% or 90% or between 75% and 98%, 95%.

Of course, the same deposition process conditions may also control the number and/or the distribution of voids 228. The size of the voids 220 may also be varied to a significant degree—the deposition process conditions providing for nanoporous and mesoporous CEM layers.

The control over the density of grain boundaries and/or an open pore porosity in the CEM layer may provide for a desired minimum value for one or both of the density of grain boundaries and the open pore porosity of the CEM layer.

Note that the density of grain boundaries and the open pore porosity in the CEM layer may be expressed in terms of a volume fraction of grains in the CEM layer 220. This volume fraction of grains may be determined for a CEM layer 220 (or a part of a CEM layer 220) by reference to grain sizes of 2 nm or more in the CEM layer 220.

Accordingly, the deposition process conditions may provide a CEM layer having a volume fraction of grains between 50% and 98%, for example, between 60% or 70% or 80% and 95% or 90% and/or an average grain size of between 2 nm and 20 nm, for example, between 7 nm, 10 nm, 15 nm and 20 nm or 15 nm.

The deposition process conditions may also provide a CEM layer having a volume fraction of grains between 50% and 98%, for example, between 60% or 70% or 80% and 95% or 90% and/or an open pore porosity of may be between 0.1% and 20.0%, for example, between 0.5% or 1.0% or 5.0% and 20%.

Figure 4:
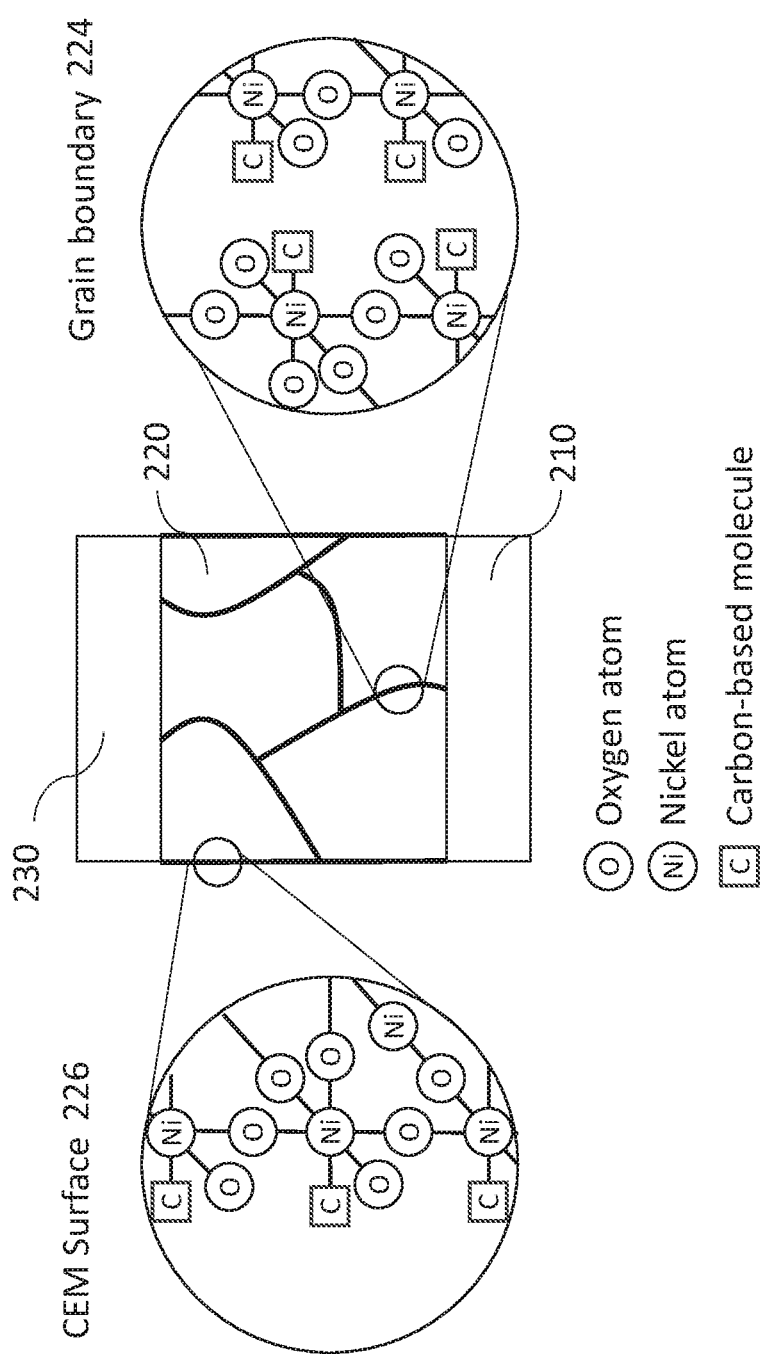
FIG. 4 is a schematic illustration showing the binding of extrinsic ligands at grain boundaries of the polycrystalline correlated electron material in the embodiment of FIG. 2.

FIG. 4 outlines one rationale for the influence of the morphology and exposed surface area of the CEM layer on the switching characteristics of a CEM switching device.

As mentioned above, a CEM may comprise a polycrystal having a lattice structure including defects (typically $O^{2-}$ (designated O) holes) which are stabilized by an extrinsic ligand dopant for the metal ion (typically $Ni^{2+}$ designated Ni).

The extrinsic ligand dopant (typically a ligand from a carbon-based molecule, designated C) bonds to the metal ion in the lattice structure by electron donation from the ligand C to the metal ion Ni and, in some cases, electron back-donation from the metal ion Ni to the ligand C.

The stabilization occurs near the surface 226 (with air) of the CEM layer 220 and at grain boundaries 224 in the CEM layer because a large defect density ($O^{2-}$ holes) in the lattice structures of the polycrystals occurs at both the surface 226 of the CEM layer and the grain boundaries 224 of the CEM layer 220.

Furthermore, the bonding of the extrinsic ligand dopant C with metal ion (Ni) stabilizing defects at on the surface or near the grain boundaries 224 of the CEM layer 220 is energetically preferred as compared to bonding of the extrinsic ligand dopant C stabilizing defects within the interior of the CEM layer 220.

The present disclosure also provides a correlated electron material (CEM) device comprising a CEM layer provided on a substrate, which CEM switching device has switching characteristics which are predetermined by a selected internal surface area and/or a selected exposed surface area of the CEM layer.

Figure 5:
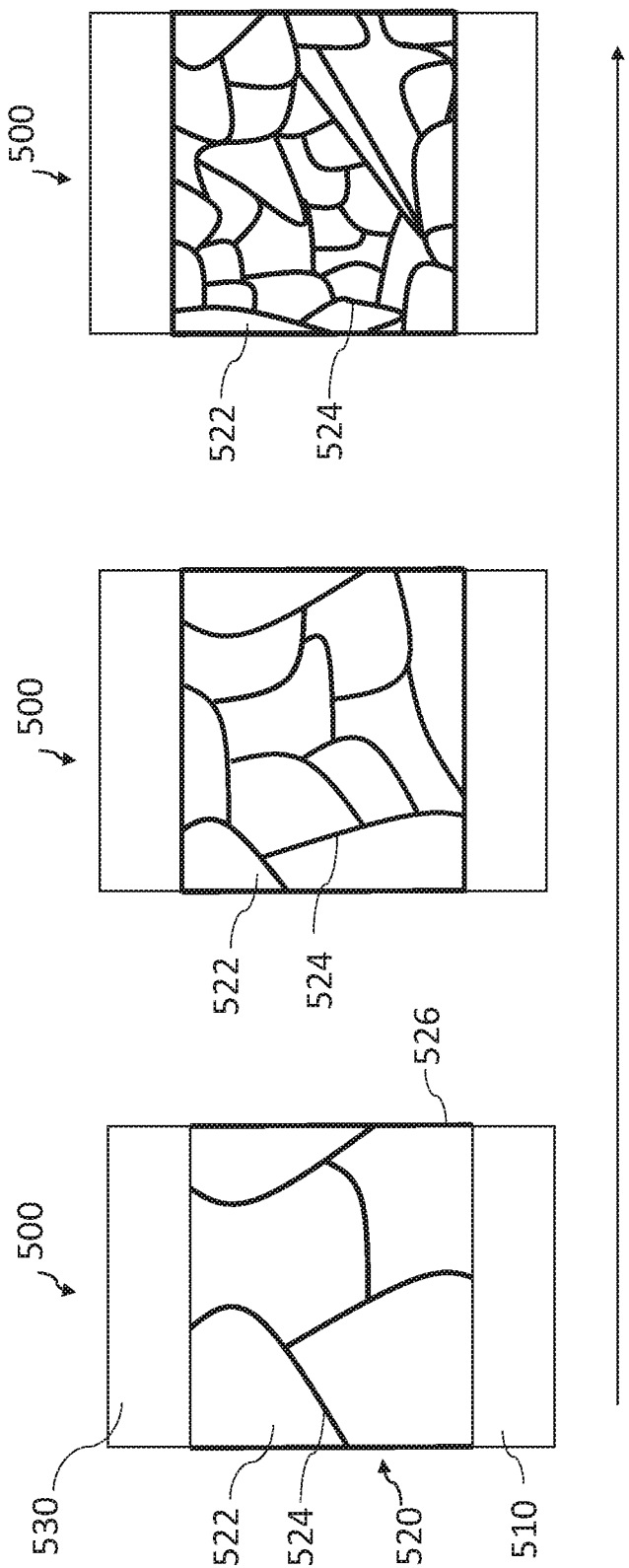
FIG. 5 is a schematic illustration of other embodiments of a switching device comprising a polycrystalline correlated electron material as compared to the embodiment of FIG. 2.

FIG. 5 highlights the control of switching characteristics of a CEM device 500 by controlling the internal surface area of the CEM layer 520 during the fabrication of the CEM switching device 500.

The CEM switching device 500 has a vertical arrangement for the conductive substrate 510, the CEM layer 520 and the conductive overlay 530.

In a first embodiment, the fabrication of the CEM switching device 500 comprises depositing a CEM layer 520 of defined thickness on the conductive substrate 510. The deposition process conditions for depositing the CEM layer 520 provide that that the CEM layer 520 comprises roughly columnar grains 522 of large average size and a low density of grain boundaries 524.

In a second embodiment, the fabrication of the CEM switching device 500 comprises depositing a CEM layer 520 of the defined thickness on the conductive substrate 510. The deposition process conditions for depositing the CEM layer 520 are different to those employed for the first embodiment and provide that the CEM layer 520 comprises grains 522 of smaller average size and a higher density of grain boundaries 524 and as compared to those of the first embodiment.

In a third embodiment, the fabrication of the CEM switching device 500 comprises depositing a CEM layer 520 of the defined thickness on the conductive substrate 510. The deposition process conditions for depositing the CEM layer 520 are different to those employed for the first embodiment and second embodiments and provide that the CEM layer 520 comprises grains 522 of small average size and a higher density of grain boundaries 524 and as compared to those of the second embodiment.

Note that the CEM layer sidewalls 526 in these devices have substantially the same height (viz. the surface area of the CEM layer exposed to air is substantially the same).

The switching characteristics for the device can be controlled by providing for a desired density of grain boundaries 522 of the CEM layer 520.

For example, amongst switching characteristics, the initial current density 104 for the device 5C may be significantly higher than for the device 5A. The device 5C may consequently exhibit faster switching or switching at lower voltages as compared to the device of 5A.

Note that when the CEM layer 520 comprises large columnar grains 522 the available surface area on or near the surface or near the grain boundaries of the CEM layer 520 is relatively low.

In that case, the extent of doping of the CEM layer 520 by an extrinsic ligand providing for electron back-donation may also be relatively low. The correlated electron switching of the CEM layer 520 may then occur only within a limited volume of the CEM layer 520.

When the CEM layer 520 comprises small grains 522 (less than 10 nm), the available surface area on or near the surface or near the grain boundaries of the CEM layer is relatively high.

In that case, the extent of doping of the CEM layer 520 by an extrinsic ligand providing for electron back-donation may also be relatively high. The correlated electron switching of the CEM layer 520 may then occur throughout substantially the whole of the volume of the CEM layer 520.

Note further that increasing the internal surface area of the CEM layer 520 requires the use of more dopant. Note, further, that an increase in the internal surface area of the CEM layer 520 (however it is achieved) can be considered to increase the "yield" of available CERAM within the CEM layer 520.

The control of the internal surface area of the CEM layer may alternatively or additionally comprise selecting an annealing process, amongst different annealing processes, for annealing the CEM layer following deposition.

The morphology and nanostructure of a CEM layer may be significantly different for a CEM layer annealed by one annealing process (for example, gradual heating) at as compared to the CEM layer annealed by another annealing process (rapid heating).

The selection of the annealing process may provide, for example, that the CEM layer is wholly amorphous or wholly polycrystalline. Of course, it may provide that the CEM layer is partly amorphous with the remainder of the CEM layer being polycrystalline.

In this embodiment, further control over the internal surface area of the CEM layer may be achieved by selecting one or more annealing process parameters, such as heating temperature, heating time, ramping rates, and, ambient temperature, whereby to control a density of grain boundaries in the CEM layer and/or an open pore porosity in the CEM layer.

The annealing process conditions may, for example, provide a CEM layer 220 comprising relatively small grains 222 that are randomly orientated. Alternatively, the annealing process conditions may provide a CEM layer 220 comprising relatively large grains in the CEM layer 220. In that case, the grains 222 may be orientated to a single direction as compared to relatively small crystals which are randomly orientated.

Of course, the same annealing process conditions may also control the number and/or the distribution of voids 228. The size of the voids 220 may also be varied to a significant degree—the annealing process conditions providing for nanoporous and mesoporous CEM layers.

The control over the density of grain boundaries and/or an open pore porosity in the CEM layer may provide for a desired minimum value for one or both of the density of grain boundaries and the open pore porosity of the CEM layer.

Note that the density of grain boundaries and the open pore porosity in the CEM layer may be expressed in terms of a volume fraction of grains in the CEM layer 220. This volume fraction of grains may be determined for a CEM layer 220 (or a part of a CEM layer 220) by reference to grain sizes of 2 nm or more in the CEM layer 220.

Accordingly, the annealing process conditions may provide a CEM layer having a volume fraction of grains between 50% and 98%, for example, between 60% or 70% or 80% and 95% or 90% and/or an average grain size of between 2 nm and 20 nm, for example, between 7 nm, 10 nm, 15 nm and 20 nm or 15 nm.

The annealing process conditions may also provide a CEM layer having a volume fraction of grains between 50% and 98%, for example, between 60% or 70% or 80% and 95% or 90% and/or an open pore porosity of may be between 0.1% and 20.0%, for example, between 0.5% or 1.0% or 5.0% and 20%.

Of course, the control over the internal surface area of the CEM layer may comprise selecting a deposition process for the CEM layer and/or an annealing process for the CEM layer. It may further comprise selecting a substrate directing crystal orientation of the CEM layer or a substrate promoting random crystal orientation in the CEM layer.

The present disclosure provides a method for controlling switching characteristics of a correlated electron material (CEM) device, comprising depositing a CEM layer on a substrate the CEM layer having a first volume fraction of grain boundaries and/or open pore porosity; and annealing the CEM layer on the substrate to provide a CEM layer having a second volume fraction of grain boundaries and/or open pore porosity, different from the first volume fraction of grain boundaries and/or open pore porosity.

In certain embodiments, the annealing provides for a second volume fraction of grain boundaries that is higher than the first volume fraction of grain boundaries. In other embodiments, the annealing provides for a second volume fraction of grain boundaries that is lower than the first volume fraction.

Note that the annealing process is carried out in the presence of a gaseous dopant providing an extrinsic ligand for the CEM layer. The annealing process may be carried out in vacuum.

FIG. 5 also highlights the use of an annealing process for the selection of switching characteristics for a CEM switching device 500.

In an embodiment, the fabrication of the CEM switching device 500 comprises depositing a CEM layer 520 of defined thickness on the conductive substrate 510. The deposition process conditions for the depositing the CEM layer 520 provide that that the CEM layer 520 comprises roughly columnar grains 522 of large average size and a low density of grain boundaries 524.

In this embodiment, the fabrication of the CEM switching device 500 continues with an annealing process, for example, a thermal annealing providing that the CEM layer 520 comprises grains 522 of smaller average size and a higher density of grain boundaries 524 and as compared to those that are deposited.

The annealing process conditions may provide that the CEM layer 520 comprises grains 522 which get progressively smaller with, for example, duration of annealing (reading FIG. 5 right to left).

Of course, the deposition process conditions for the depositing the CEM layer 520 provide that that the CEM layer 520 comprises grains 522 of large average size and a high density of grain boundaries 524.

The annealing process conditions may provide that the CEM layer 520 comprises grains 522 (not necessarily columnar) which get progressively larger with, for example, duration of annealing (reading FIG. 5 left to right).

The present disclosure provides a method for tuning switching characteristics of a correlated electron material (CEM) device, which method comprises controlling an internal surface area and/or an exposed surface area of the CEM layer. The switching characteristics may be tuned for a particular application, such as CERAM, for the CEM device.

Figure 6:
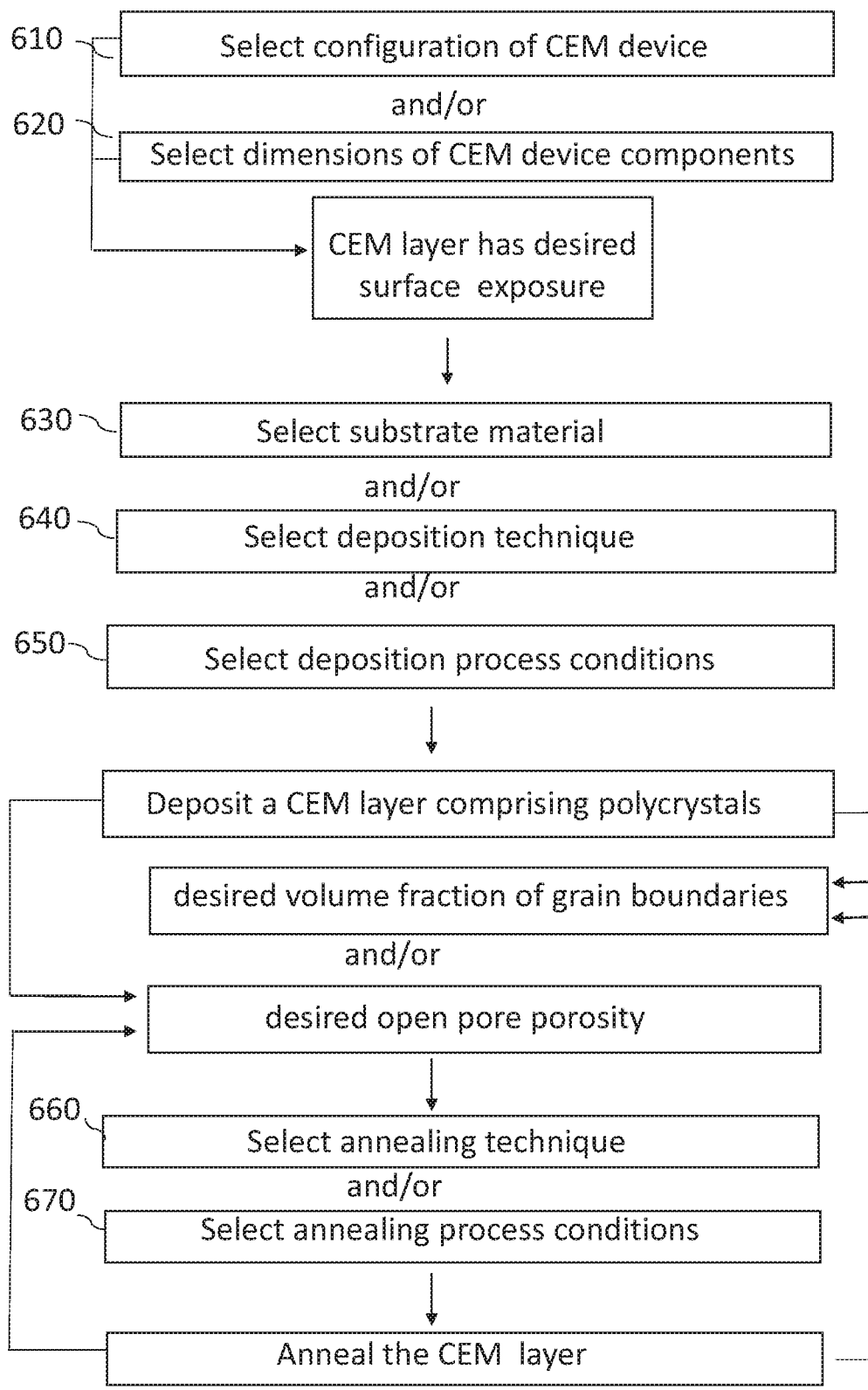
FIG. 6 is a schematic diagram showing embodiments of a method for controlling the switching characteristics of a switching device comprising a correlated electron material.

FIG. 6 is a flow chart showing one or more selections that may be made to control the switching characteristics of a fabricated CEM switching device.

In a first instance, a selection 610 of a configuration, for example, vertical or horizontal, for the CEM switching device is made.

In a second instance a selection 620 of dimensions for the substrate, the CEM layer and the one or more conductive overlays of the CEM switching device is made.

For a device having vertical configuration, the selection in dimensions may relate primarily to the thickness of the CEM layer with dimensions such as length, width and overall height being otherwise conventional.

In that case, the thickness of the CEM layer may be selected having regard to a desired density of grain boundaries (or average grain size) in the CEM layer in the finally formed device.

The thickness of the CEM layer (in the direction of film growth) may be between 5 nm and 150 nm, for example, between 10 nm and 100 nm or 50 nm or 25 nm.

For a device having horizontal configuration, the selection in dimensions may relate primarily to the exposed surface area of the CEM layer and the dimensions of the conductive overlays with other dimensions for the device otherwise being conventional.

In that case, the thickness of the CEM layer may be selected having regard to a desired density of grain boundaries (or average grain size) in the CEM layer in the finally formed device.

The thickness of the CEM layer may be between 5 nm and 150 nm, for example, between 10 nm and 100 nm or 50 nm or 25 nm. The CEM device may have a cross-sectional area which is conventional, for example, between 4 $nm^2$ and 150 $\mu m^2$. The exposed surface area of the CEM layer may, for example, be between 0.5 $\mu m^2$ and 15 $\mu m^2$.

In a third instance, a selection 630 of substrate material is made. The selection may relate a desired surface roughness of the substrate material (as well as to methods for controlling surface roughness of a substrate material) or to an underlying crystal orientation (for example, {111} or {100}) of the substrate material.

The selection of surface roughness and/or crystal orientation may, in particular, be made in combination with a selected deposition process and/or selected deposition process conditions.

For a device having vertical configuration, the substrate material may be selected to be a conductive material which (depending on how it is deposited—expand; clarity) directs crystal orientation of a polycrystalline CEM layer and/or large grain size. The degree of crystal orientation may be greater than 60% and may be greater than 90% or 95% and even as high as 100%.

Alternatively, the substrate material may be selected to be a conductive material which promotes random crystal orientation and/or small grain size.

For a device having horizontal configuration, the substrate may be selected to be an insulating material which directs crystal orientation of a polycrystalline CEM layer and/or large grain size. The degree of crystal orientation may be greater than 60% and may be greater than 90% or 95% and even as high as 100%.

Alternatively, the substrate material may be selected to be insulating material which promotes random crystal orientation and/or small grain size.

In a fourth instance, a selection 640 of a deposition technique or process for depositing the CEM layer is made.

The selection of a deposition process may comprise selection of a suitable physical vapor deposition (PVD) technique over a suitable chemical vapour deposition (CVD) technique or a suitable chemical solution deposition (CSD) technique as well as selection of amongst alternative PVD techniques or CVD techniques or CSD techniques.

Suitable CVD techniques include atmospheric CVD, low pressure CVD and ultrahigh vacuum CVD such as aerosol assisted CVD, direct liquid injection CVD, hot wall CVD, cold wall CVD, microwave plasma assisted CVD, plasma enhanced CVD, remote plasma enhanced CVD, low energy plasma enhanced CVD, atomic layer deposition, combustion CVD, hot filament CVD, rapid thermal CVD, photo-initiated CVD as well as vapor phase epitaxy, laser CVD and hybrid physical-chemical CVD.

Suitable PVD techniques include cathodic arc deposition, electron beam, evaporative deposition, close-space sublimation, pulsed laser deposition, pulsed electron or laser deposition as well as sputter deposition including ion beam sputtering, reactive sputtering and ion plating.

Suitable chemical solution deposition techniques include sol-gel processing and metallo-organic decomposition and may utilize spin coating, spray coating or dip-coating techniques followed by heating to achieve pyrolysis and crystallization.

In certain embodiments the selection of the deposition process comprises selection of a metallo-organic deposition process technique.

In a fifth instance, a selection of deposition process conditions 650 for the selected deposition process for the CEM layer is made.

The selection of deposition process conditions may comprise selecting a value for one or more of deposition process parameters, such as flow rate of reactants, applied power, temperature of reaction, etc. which control the deposition of the CEM layer. The selection may also comprise varying the value of one or more deposition process parameters during the deposition of the CEM layer.

In embodiments, the selection of deposition process conditions provides a polycrystalline CEM layer having a desired volume fraction of grain boundaries and/or a desired open pore porosity.

In a sixth instance, a selection 660 of an annealing technique or process for annealing the CEM layer after deposition is made. The selection may be made when a selection of deposition process conditions for the CEM layer has not made.

The selection of annealing process may comprise selecting a thermal treatment, such as rapid thermal heating (RTH) amongst alternative thermal treatments for annealing the CEM layer.

In a seventh instance, a selection 670 of annealing process conditions may be made.

The selection may comprise selecting a value for one or more annealing parameters such as final temperature, temperature ramp, ambient temperature, treatment time and the like. It may also comprise varying the value of one or more annealing process parameters during the deposition of the CEM layer.

In embodiments, the selection of annealing process conditions provides a polycrystalline CEM layer having a desired volume fraction of grain boundaries and/or a desired open pore porosity.

Note in the foregoing that the desired volume fraction of grain boundaries and/or a desired open pore porosity correspond to desired switching characteristics for the CEM device. Note also that the deposition process conditions and/or the annealing process conditions may be determined for particular selections by fabrication and testing of multiple CEM devices using different process conditions until a CEM device having the desired switching characteristics is obtained.

Note also that references to a polycrystalline CEM layer include references to a CEM layer which is in part polycrystalline and in part amorphous (viz. semi-polycrystalline).

The invention claimed is:

1. A method for controlling switching characteristics of a correlated electron material device comprising a correlated electron material (CEM) layer, which method comprises controlling one or more of:
   a density of grain boundaries in the CEM layer;
   an open pore porosity in the CEM layer; and/or
   a surface area of exposed surfaces of the CEM layer,
      wherein the controlling switching characteristics of the CEM device comprises forming the CEM layer on a substrate to provide a polycrystalline CEM thin film layer having a selected density of grain boundaries and/or a selected open pore porosity.

2. The method of claim 1, wherein the controlling comprises forming the CEM layer by deposition on the substrate wherein: the deposition comprises controlling deposition process conditions to provide the polycrystalline CEM thin film layer to have the selected density of grain boundaries and/or the selected open pore porosity.

3. The method of claim 1, wherein the controlling comprises further comprises subsequent annealing on the substrate, wherein:
   the annealing comprises controlling annealing process conditions to provide the polycrystalline CEM thin film layer to have the selected density of grain boundaries and/or the selected open pore porosity.

4. The method according to claim 1, wherein the selected density of grain boundaries comprises a selected minimum value and/or the selected open pore porosity comprises a selected minimum value.

5. The method according to claim 1, wherein the selected open pore porosity is between 0.1% and 20.0%.

6. The method according to claim 1, providing that the polycrystalline CEM layer has a volume fraction of grains between 50% and 98%.

7. The method according to claim 1, providing that the polycrystalline CEM thin film layer has an average grain size between 2 nm and 20 nm.

8. The method according to claim 1, wherein the CEM comprises a metal-containing chemical compound which is doped by an extrinsic ligand for the metal.

9. The method according to claim 8, wherein the extrinsic ligand comprises an electron back-donating ligand for the metal.

10. The method according to claim 9, wherein the extrinsic ligand comprises a carbon-containing ligand providing a carbon atom concentration in the CEM thin film layer between 0.1 atom % and 30 atom %.

11. A correlated electron material switching device comprising a correlated electron material (CEM) layer provided on a substrate, wherein the CEM layer comprises polycrystals and further has:
   a volume fraction of grains between 50% and 98%;
   an average grains size between 5 nm and 20 nm; or
   an average open pore porosity between 0.1% and 20.0%, or
   a combination thereof.

12. A method for controlling switching characteristics of a correlated electron material device, comprising:
   depositing a polycrystalline correlated electron material (CEM) layer on a substrate, the polycrystalline CEM having a first volume fraction of grain boundaries; and
   annealing the polycrystalline CEM layer on the substrate to provide a second volume fraction of grain boundaries in the polycrystalline CEM layer that is different from the first volume fraction of grain boundaries in the polycrystalline CEM layer,
   wherein the annealing the polycrystalline CEM layer further comprises controlling one or more annealing process conditions so that the second volume fraction of grain boundaries in the polycrystalline CEM layer is a selected volume fraction.

13. The method according to claim 12, providing that the second volume fraction of grain boundaries in polycrystalline CEM layer is greater than the first volume fraction of grain boundaries in the polycrystalline CEM layer.

14. The method according to claim 12, wherein the CEM comprises a metal-containing chemical compound which is doped by an extrinsic ligand for the metal.

15. The method according to claim 14, providing that the polycrystalline CEM layer has a concentration of the extrinsic ligand substantially the same after the annealing as before the annealing.

16. A method for controlling switching characteristics of a correlated electron material device, comprising:
   depositing a polycrystalline correlated electron material (CEM) layer on a substrate, the polycrystalline CEM having a first open pore porosity; and
   annealing the polycrystalline CEM layer on the substrate to provide a second open pore porosity in the polycrystalline CEM layer that is different from the first open pore porosity in the polycrystalline CEM layer,
   wherein the annealing the polycrystalline CEM layer further comprises controlling one or more annealing process conditions so that the second open pore porosity in the polycrystalline CEM layter is a selected open pore porosity.

17. The method according to claim 16, providing that the second open pore porosity in the polycrystalline CEM layer is higher than the first open pore porosity in the polycrystalline CEM layer.

18. The method according to claim 16, wherein the CEM comprises a metal-containing chemical compound which is doped by an extrinsic ligand for the metal.

19. The method according to claim 18, providing that the polycrystalline CEM layer has a concentration of the extrinsic ligand substantially the same after the annealing as before the annealing.

* * * * *